United States Patent [19]

Celio

[11] Patent Number: 4,513,371
[45] Date of Patent: Apr. 23, 1985

[54] COMPUTER INTERFACE APPARATUS USING SPLIT-CYCLE LOOKAHEAD ADDRESSING FOR FASTER ACCESS TO PAGED MEMORY

[75] Inventor: John A. Celio, San Diego, Calif.

[73] Assignee: NCR Corporation, Dayton, Ohio

[21] Appl. No.: 402,883

[22] Filed: Jul. 29, 1982

[51] Int. Cl.³ .................. G06F 9/38; G06F 13/00
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 3,970,999 | 7/1976 | Elward | 364/200 |
| 4,258,417 | 3/1981 | Berglund | 364/200 |
| 4,340,932 | 7/1982 | Bakula et al. | 364/200 |
| 4,388,685 | 6/1983 | Kotok | 364/200 |
| 4,403,283 | 9/1983 | Myntti et al. | 364/200 |
| 4,410,941 | 10/1983 | Barrow et al. | 364/200 |
| 4,447,877 | 5/1984 | Grondalski | 364/200 |

Primary Examiner—James D. Thomas
Assistant Examiner—Archie E. Williams
Attorney, Agent, or Firm—J. T. Cavender; Edward Dugas

[57] ABSTRACT

This apparatus is used for minimizing the performance degradation due to address translation in computer systems employing random access memory and paging. It translates initial addresses into real addresses utilizing addressable memory and substitute paging. It decreases access time by not translating virtual address bits that are also real address bits and by commencing memory access using the available real address bits as they are available.

1 Claim, 8 Drawing Figures

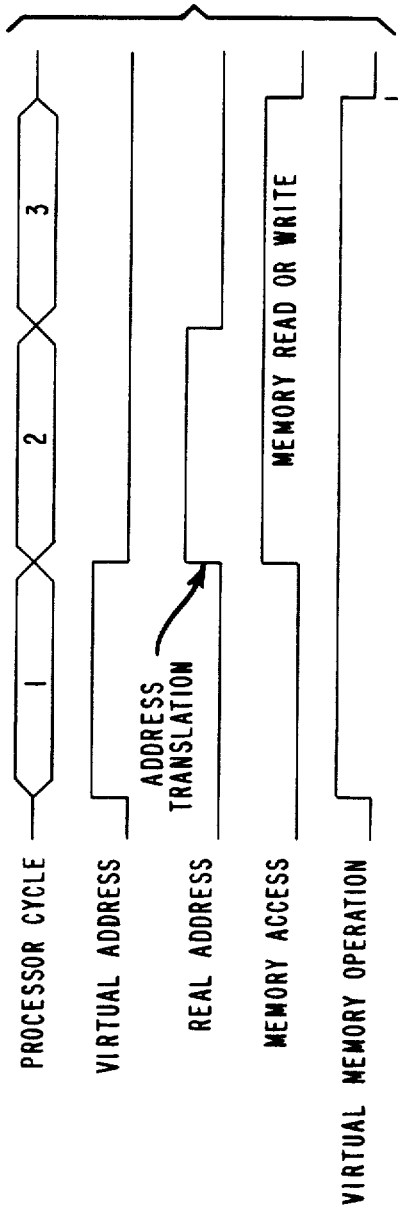
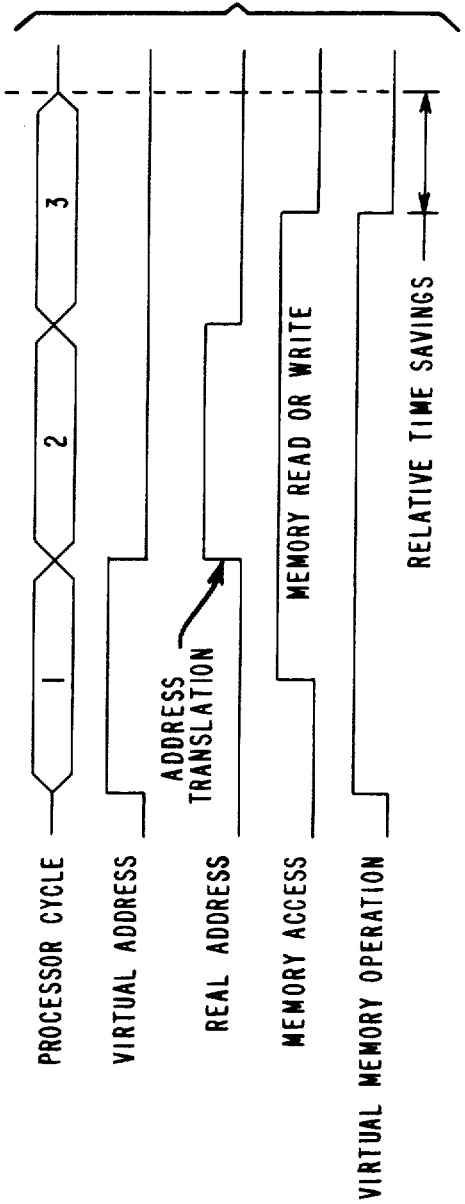

COMPUTER INTERFACE APPARATUS USING SPLIT-CYCLE LOOKAHEAD ADDRESSING FOR FASTER ACCESS TO PAGED MEMORY

BACKGROUND OF THE INVENTION

The present invention is adapted for use in computer systems and, more particularly, is an improved address translation apparatus for translating virtual addresses into real addresses utilizing random access memory and substitute paging.

The invention provides an apparatus improvement for maximizing system performance on all virtual memory operations which require address translation prior to initiating real memory access. Medium to large scale computer systems utilize a virtual memory concept, in one form or another, to maximize the efficiency of the single most expensive component in the processing unit, the memory storage element. Generally, for performance reasons, at least some part of the storage element is implemented using semiconductor memory chips. Currently, the most popular memory chips are the dynamic random access memories, DRAM's, since they afford high densities (up to 65,536 bits per chip), good performance and they are reasonably priced compared to alternate technologies. The amount of physical memory provided in an actual system will be restricted due to cost, power, packaging and/or other considerations.

Virtual memory storage allows software programs to be written and executed on a system using an address space that is greater than the actual physically addressable memory used in the system. This is possible because additional memory (slower speed) is provided by way of disc storage, tape, cards, etc. The additional or bulk storage memory, stores pages of information which can be transferred when needed into the computer's higher speed memory to effectively increase the working size of the computer's memory.

Memory management resources map sections of a user's program in groups of bytes (8 bits), often referred to as pages, into the physical memory as required. Once the page is in memory, the data on that page can be accessed provided that some element within the processor can remember the mapping function between the virtual address and the real (physical) memory address. For performance reasons, the mapping function is most frequently implemented in hardware. Unless exotic hardware techniques are employed, this mapping, or address translation operation as it is also known, is never accomplished in zero time. The actual overhead in the system may be as much as ½ of the time it would otherwise take to access memory in a non-translation mode. In conventional hardware implementations memory access time using address translation would be calculated by summing the amount of time it takes to convert a virtual address to a real address with the amount of time it takes to perform the actual memory operation.

It therefore is highly desirable to decrease the amount of time allocated to address translation without substantially increasing the costs associated with such a decrease. The present invention provides a unique implementation for minimizing the address translation time.

SUMMARY OF THE INVENTION

The invention operates upon the recognition that in a page substitution scheme only the first several bits of the virtual address are necessary to identify the location of a page of data within real memory. The relative position of each element in a page of data remains the same whether the address is virtual or real. Such being the case, translation is complete when that portion of the virtual address that is not identical to the real address is translated (mapped) into its corresponding real address and time savings can be had by commencing memory access before all of the real address bits are available.

The present invention is directed to an improvement in an apparatus for decreasing the access time to addressable memories which memories contain pages of stored data addressable through real addresses. Virtual addressing techniques are used to expand the capabilities of the memory. A memory bus is connectable to at least one bank of addressable memory units which memory units store the pages of addressable data. A processor is coupled to the memory bus for providing the virtual addresses which addresses consist of high and low order bits wherein the lower order bits correspond to real address bits and the higher order bits are translatable to real address bits. An address translator is coupled to the memory bus for translating the provided virtual addresses into real addresses and for forwarding the real addresses to the memory bus. The apparatus is improved with the improvement comprising; a memory interface for interfacing the addressable memory to the memory bus with the memory interface being comprised of a first means for receiving and gating the lower order virtual address bits to the addressable memory to commence memory access prior to the completion of translation by the address translator. A second means receives and gates the translated higher order bits of the provided virtual address corresponding to the real address from the memory bus to the addressable memory to complete memory addressing. A decoder is operatively coupled to the second means for converting select higher order address bits into addressable memory bank select signals. A first logic means controls the first and second means to cause the first and second means, with the presence of a virtual address on the memory bus, to hold the higher and the low order virtual address bits present on the memory bus during a first cycle and to hold the translated virtual address bits present on the memory bus during a second cycle. A multiplexer is coupled to the first and second means for receiving and alternately gating, to the addressable memory, the held lower order virtual address bits during the first cycle and the held high order translated address bits during the second cycle.

Accordingly, it is an object of the present invention to decrease memory access time when using virtual memory.

It is another object of the present invention to provide a means for commencing memory access before each element of the virtual address has been translated.

It is another object of the present invention to provide an apparatus for accomplishing the aforementioned objects.

These and other objects of the present invention will become more apparent when taken in conjunction with the following description and drawings, throughout which like characters indicate like parts, and which drawings form a part of this application.

BRIEF DESCRIPTION OF THE DRAWINGS

FIG. 1 is a group of waveforms depicting the time required to perform a virtual memory operation in the prior art.

FIG. 2 is a group of waveforms depicting the time required to perform a virtual memory operation utilizing the present invention;

DESCRIPTION OF THE PREFERRED EMBODIMENT

In FIG. 1 there is shown a timing diagram for a standard memory operation utilizing virtual address translation. As the processor enters cycle 1, the virtual address is being translated bit by bit into the corresponding real address. At the start of processor cycle 2, the translated virtual address is available as a real address and the memory access cycle commences. The access cycle may be for purposes of reading or writing. The total memory operation commences at the beginning of processor cycle 1 and terminates at the end of processor cycle 3.

Referring now to FIG. 2, at the commencement of processor cycle 1, the virtual address commences the address translation process with the high order bits looked at. In the present invention, recognition of the fact that for a paging substitution scheme, the bits comprising the virtual address are, for the lower order bits, the same as for the real address. These lower order bits can be taken directly from the virtual address without the necessity of translation, making those bits available to the memory circuit as real address bits so that memory accessing can be commenced prior to the termination of processor cycle 1. As shown in the timing waveform entitled virtual memory operation, the relative time savings is shown as equal to approximately one-half of a normal processor cycle time. More specifically, the savings is directly related to the row address strobe, $\overline{RAS}$, and column address strobe, $\overline{CAS}$, timing requirements of the DRAM used in the memory implementation.

Figure 3:
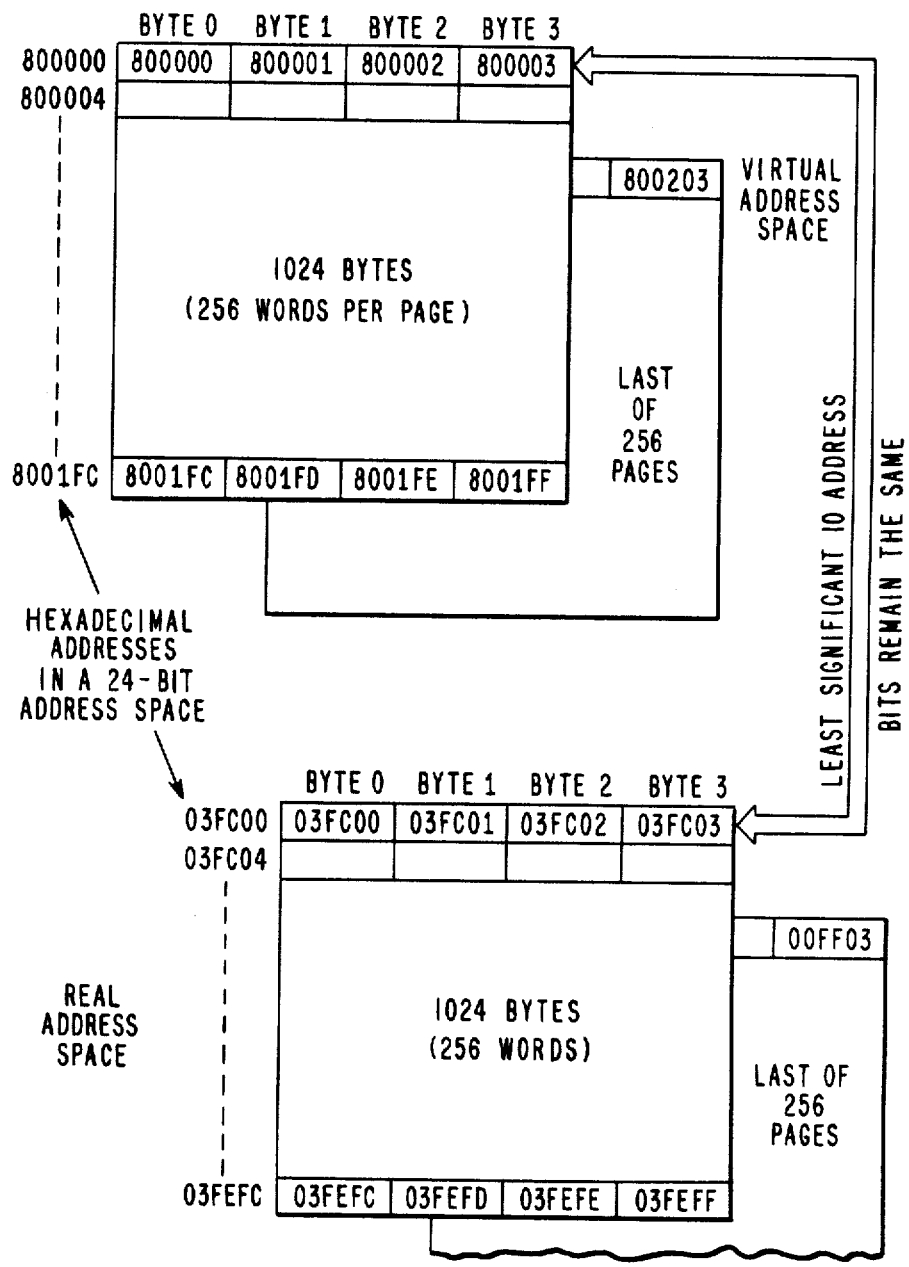
FIG. 3 illustrates the correspondence between a page of data in virtual address space and in real address space.

Referring to FIG. 3, in a matrix diagram form, the virtual address spaces are shown containing a word of data at location 800000 (HEXADECIMAL) within a 24-bit virtual address space. The word resides in the first word of a page where a page contains 1024 bytes or 256 words (4 bytes per word). When the page is assigned a slot within the real memory, the 1024 bytes in the page retain their same relationship to the beginning of the page independent of the physical location of the page in real memory. Therefore, the real memory address of the data word, for the illustration, is 03FC00 (HEXADECIMAL) with the least significant 10 bits remaining the same. In the preferred embodiment of the invention the memory size is a 256K byte memory, therefore, real address space would consist of 256 pages of 256 words (1K bytes) each. When a page is assigned a slot within the real memory, the 1024 bytes of data in the page retain the same relationship to the beginning of the page independent of the physical location of the page in real memory. Therefore, the real memory address of the data byte at virtual address 800000 is 03FC00 with the least significant 10 bits remaining 0. Likewise, the data byte at virtual address 800001 receives a real memory address of 03FC01.

Figure 4:
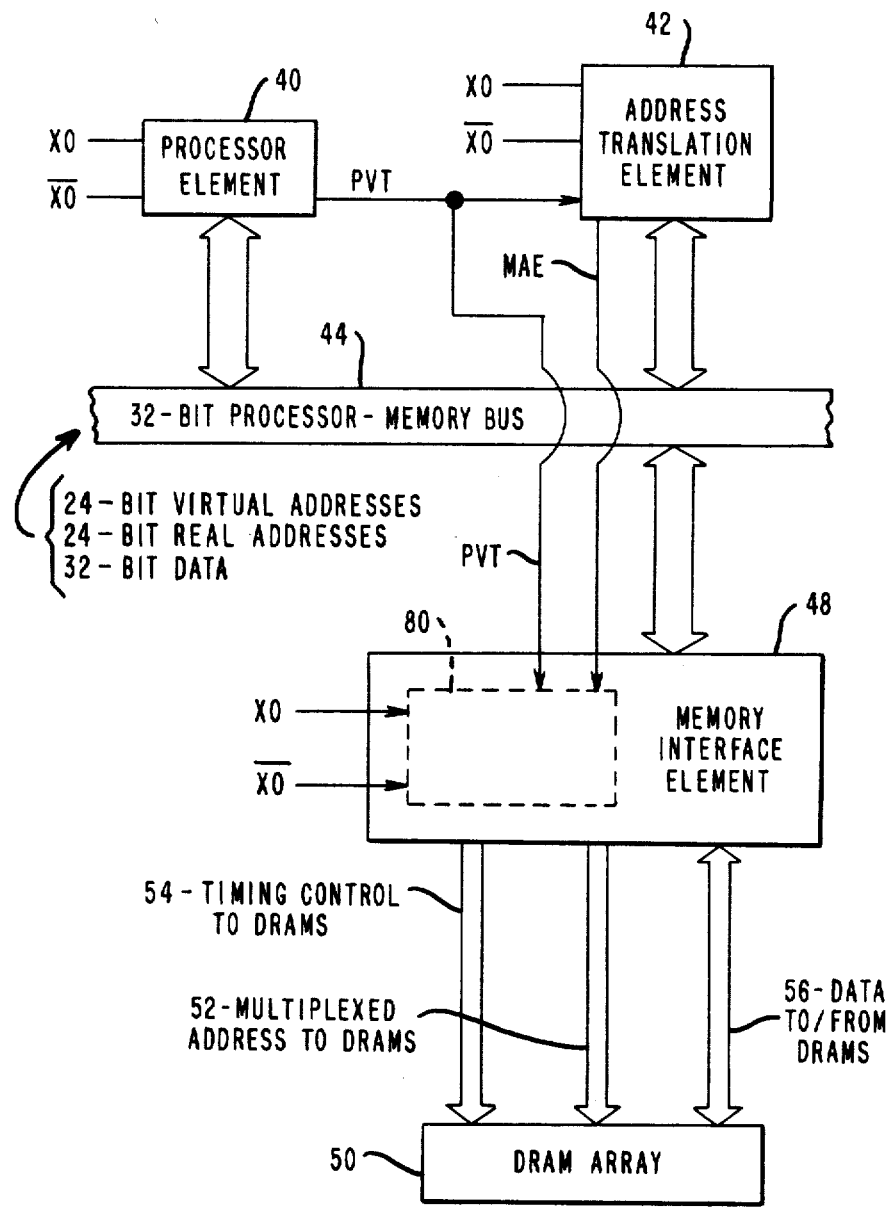
FIG. 4 illustrates in block diagram form a typical virtual address system.

Referring to FIG. 4, a 32-bit processor memory bus 44 interconnects a processor element 40, an address translation element 42 and a memory interface element 48. The processor element 40 generates the virtual memory address and the address translation element 42 converts the virtual address to a real address. The memory interface element 48 generates the timing strobes required for the memory array 50 as well as the memory address inputs. Logic 80 within memory interface element 48 provides the signals for implementing the present invention. The logic will be described in detail in the description of FIG. 6. Data read from and/or written into the memory array 50 traverses a coupling path 56 to the memory interface element 48. Memory address information traverses path 52 and timing control signals traverse path 54.

Figure 5:
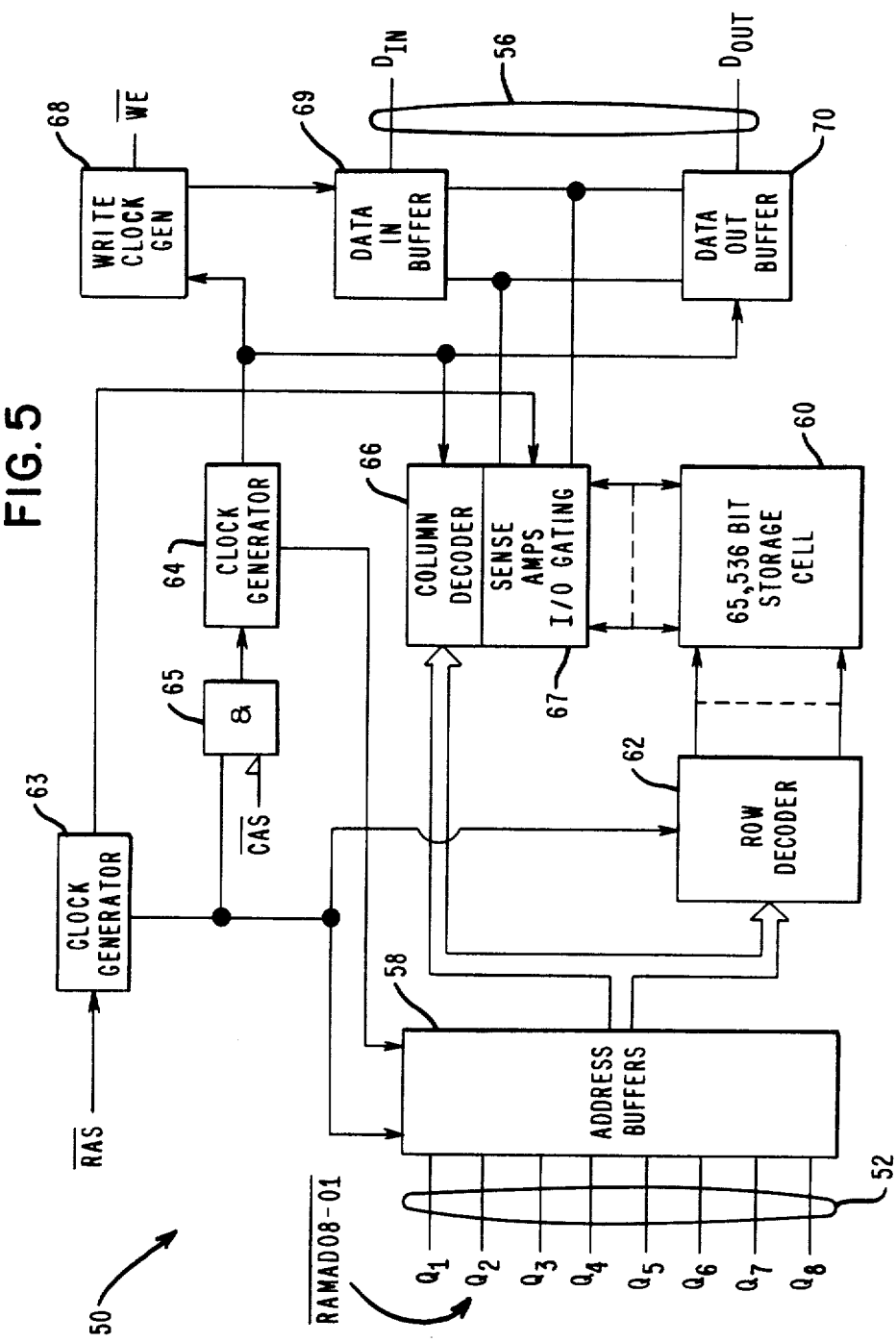
FIG. 5 illustrates in block diagram form a typical memory arrangement for providing dynamic real memory storage.

Referring to FIG. 5, wherein is disclosed a block diagram of the type well-known for a 65K bit DRAM memory (example, FUJITSU MB8264). A 65K bit storage cell 60 is accessed by signals from column and row address decoders 66 and 62, respectively. The column and row decoders receive address signals from the address buffers 58. The addresses into the address buffer are time division multiplexed with the first eight bits of a 16 bit address corresponding to a row decode and the second eight bits corresponding to a column decode. The multiplexing of the row and column address is determined by the state of the signals $\overline{RAS}$ and $\overline{CAS}$. The signal $\overline{RAS}$ is directed to the input of a clock generator 63 and the signal $\overline{CAS}$ is directed to an input of an AND gate 65. The output of AND gate 65 is directed to the input of a clock generator 64. The row address signal is generated first and enables the column addressing signal as evidenced by the fact that the clock generator 63 provides an enabling signal to the AND gate 65. If a write operation is desired, a write enable signal $\overline{WE}$ is applied to the write clock generator 68. Generator 68 enables the data in buffer 69. Data stored in buffer 69 is then directed to sense amps and I/O gating circuit 67 and to the memory 60. The sense amp and I/O gating circuit 67 will then write the data into the proper address location. If a normal read cycle is to occur, the sense amps and I/O gating circuit 67 will read the addressed data from the memory 60 and direct the data to an output buffer 70. The data stored in buffer 70 is directed to the D out line which is part of the coupling path 56.

Figure 6A:
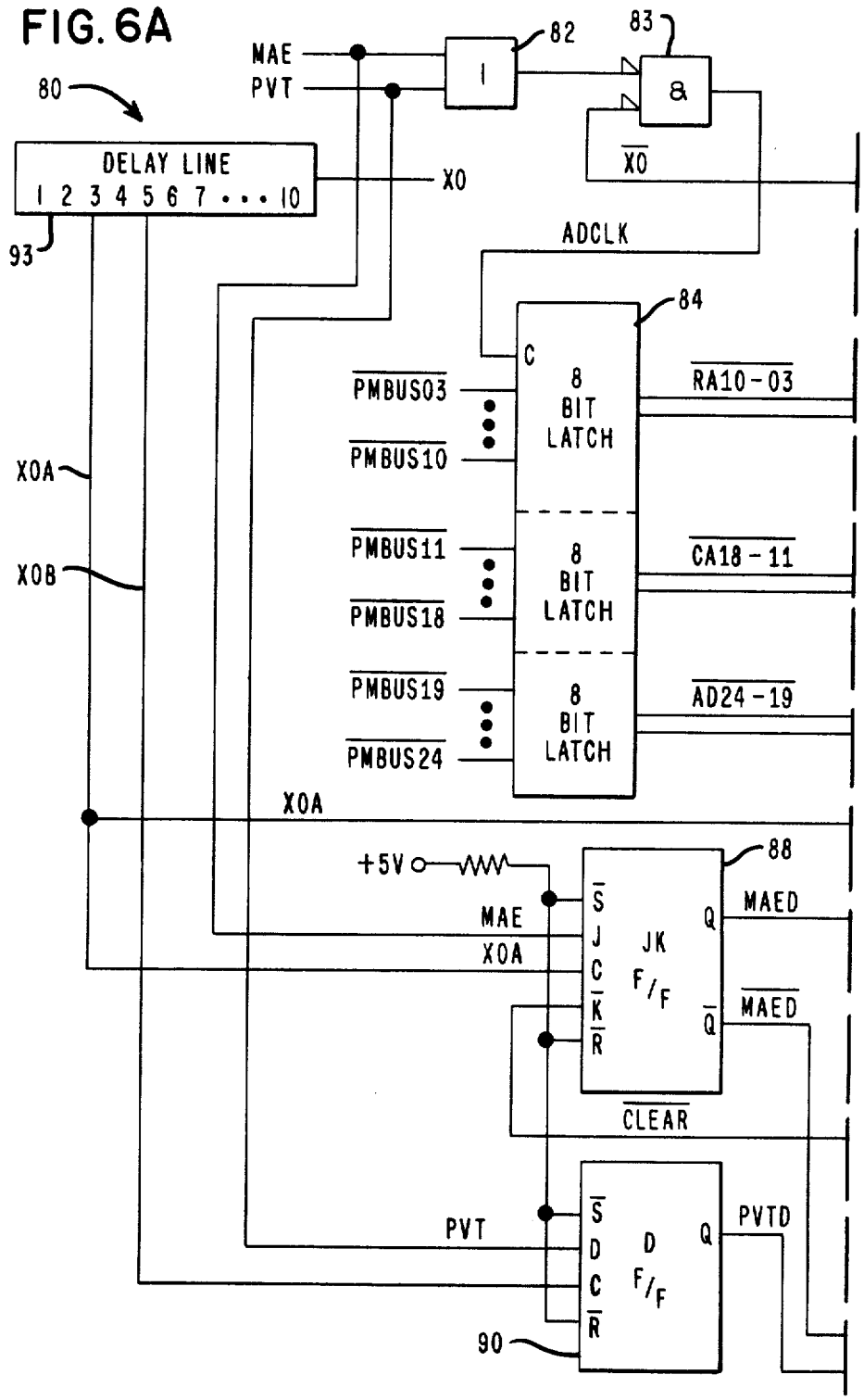
FIGS. 6A and 6B illustrate in logic block diagram form the preferred logic implementation for the present invention.
Figure 6B:
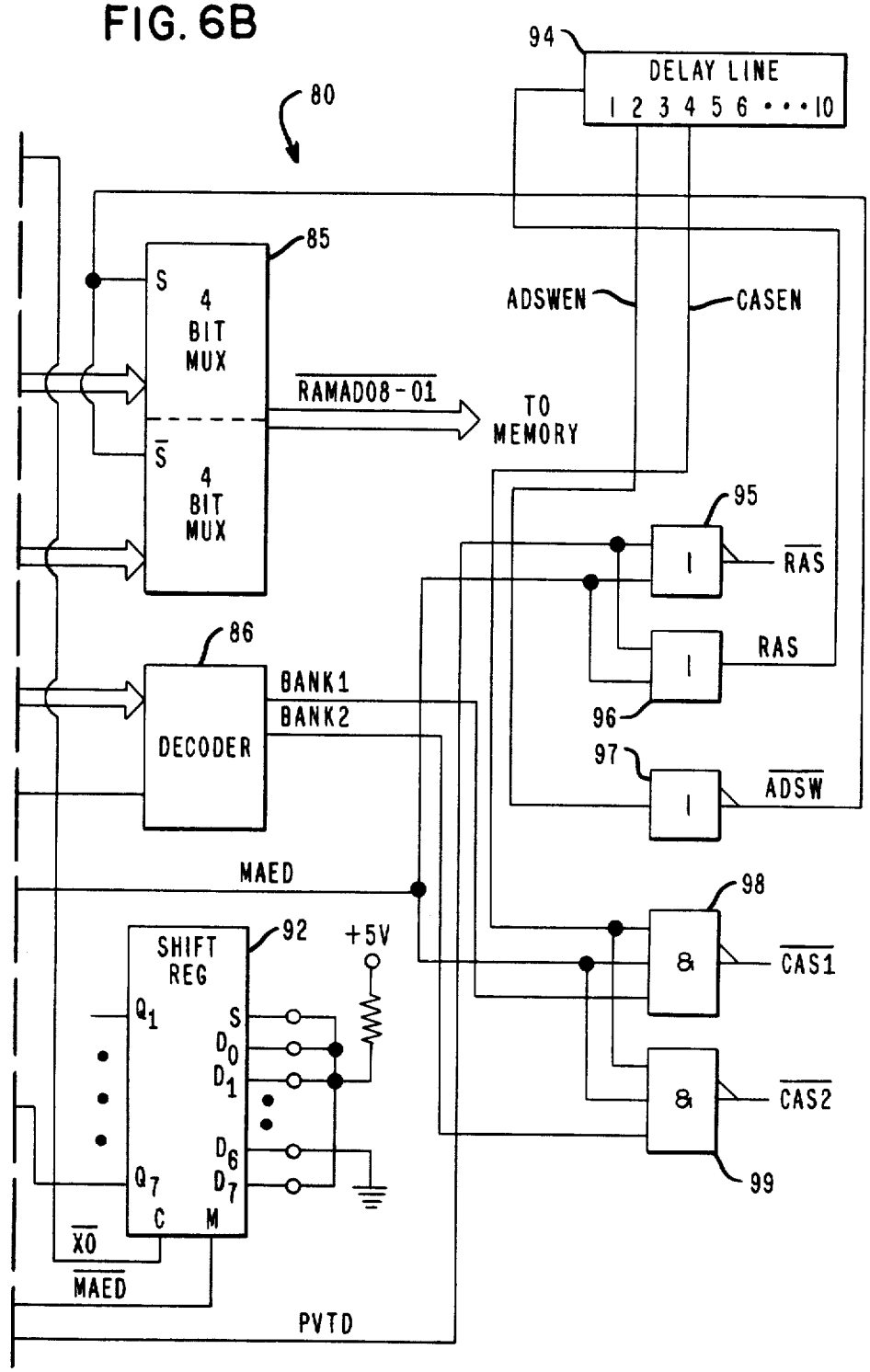

Referring to FIG. 6, the logic implementation 80 shown therein is contained within the memory interface element 48. An OR gate 82 receives as inputs the memory address enable signal MAE which indicates that a real address is present on the bus 44 and the processor virtual transfer signal PVT which indicates that a virtual address is present on the bus 44. These signals along with the clocking signal $\overline{X_0}$ present in virtual systems and their derivation, for simplicity purposes, will not be discussed in detail. The output of OR gate 82 is directed as an input to an AND gate 83 which has as a gating input the system clocking signal $X_O$. The output of AND gate 83 acts as a clocking signal for the latching circuit 84. The latching circuit 84 is comprised of three 8-bit latch circuits (SN74LS373) cascaded to form a 22-bit latch. The inputs of each latch are a corresponding line on the 32-bit processor memory bus for 22 of the bus lines labeled $\overline{\text{PMBUS24-03}}$. Bits 1 and 2 are not required because memory data is being accessed a word at a time. Bits 1 and 2 determine byte selection within a word. Bits 32-25 are not required because the maximum memory address is contained within 24 bits. During the time when $X_O$ and PVT are active, the PM bus inputs are received by and passed through the latch and appear at the latch outputs. With $X_O$ being the gating control signal, when it goes high the latch closes. The signals on bus lines 10-3 are the row address signal $\overline{\text{RA10-03}}$ for a 65K DRAM with the signals on bus lines 11-18 being the column addresses $\overline{\text{CA18-11}}$. Bus lines 19-24 carry the address signals $\overline{\text{AD24-19}}$. These address signals address the particular memory bank, of which there is only one, in the preferred embodiment (32, 65K-bit DRAMS equals 256K bytes).

A 2:1 multiplexer 85 receives at its inputs the signals $\overline{\text{RA10-03}}$ and $\overline{\text{CA18-11}}$ and in response to a multiplexing signal $\overline{\text{ADSW}}$ determines which of the two inputs will appear at its output. The multiplexer consists of two 4-bit 2:1 multiplexer circuits (SN74LS157). The clock signal $X_O$ is directed to an input of a standard 50 nsec. delay line 93 with 5 nsec. taps which delay line provides at its outputs the two delayed versions of the clocking signal $X_O$ called $X_{OA}$ and $X_{OB}$. The delay is required to permit the address signal to propagate through to the memory with enough set up time to allow for the stabilization of signals. These delayed clocking signals are directed to the clocking inputs of a JK flip-flop 88 and to a D-type flip-flop 90. In addition, on the J input of flip-flop 88, the memory address enable signal MAE is applied and on the D-type flip-flop 90 the processor virtual transfer signal PVT is applied to the D input. The output signals from flip-flop 88 are; at the Q output the signal MAED and at the $\overline{Q}$ output the signal $\overline{\text{MAED}}$. The output of flip-flop 90 is the signal PVTD taken from the Q output. An eight stage shift register 92 receives at its mode input (M) the signal $\overline{\text{MAED}}$ from flip-flop 88. In addition, the clocking signal $X_O$ is directed to the clock (C) input of an 8-bit shift register 92 (SN74LS165). The output of the shift register is taken at the Q7 output terminal and is identified as the clear signal $\overline{\text{CLEAR}}$ which signal is directed to the $\overline{K}$ input of flip-flop 88. Shift register 92 has its D6 input connected to ground with its remaining inputs D0 through D5, D7 and S connected to +5 volts. OR gates 95 and 96 receive the PVT and the MAED signals as inputs to provide the signals $\overline{\text{RAS}}$ and RAS at their outputs. The signal RAS is directed to a second 50 nsec. delay line 94, the outputs of which are taken from taps 2 and 4 to provide the delayed RAS signals ADSWEN and CASEN. The ADSWEN signal is directed to the input of an inverter 97 to provide the inverted output signal $\overline{\text{ADSW}}$. This signal is the multiplex switching signal applied to the S inputs of the 2:1 multiplexer 85.

A multiplicity of AND gates corresponding in number to the number of banks in the memory are provided. In this particular embodiment there is only one of these AND gates, but two of which 98 and 99 are shown as representatives of the wiring of the remaining gates in a system requiring larger memory. Each of the AND gates receives as an input the signals CASEN and MAED. In addition, each AND gate receives its own respective output from the decode block 86. The decode block consists of as many gates or decoder chips to select the appropriate bank of DRAM chips. The output of each of the AND gates is the respective signal $\overline{\text{CAS1}}$ for AND gate 1 and $\overline{\text{CAS2}}$ for AND gate 2, etc.

Figure 7:
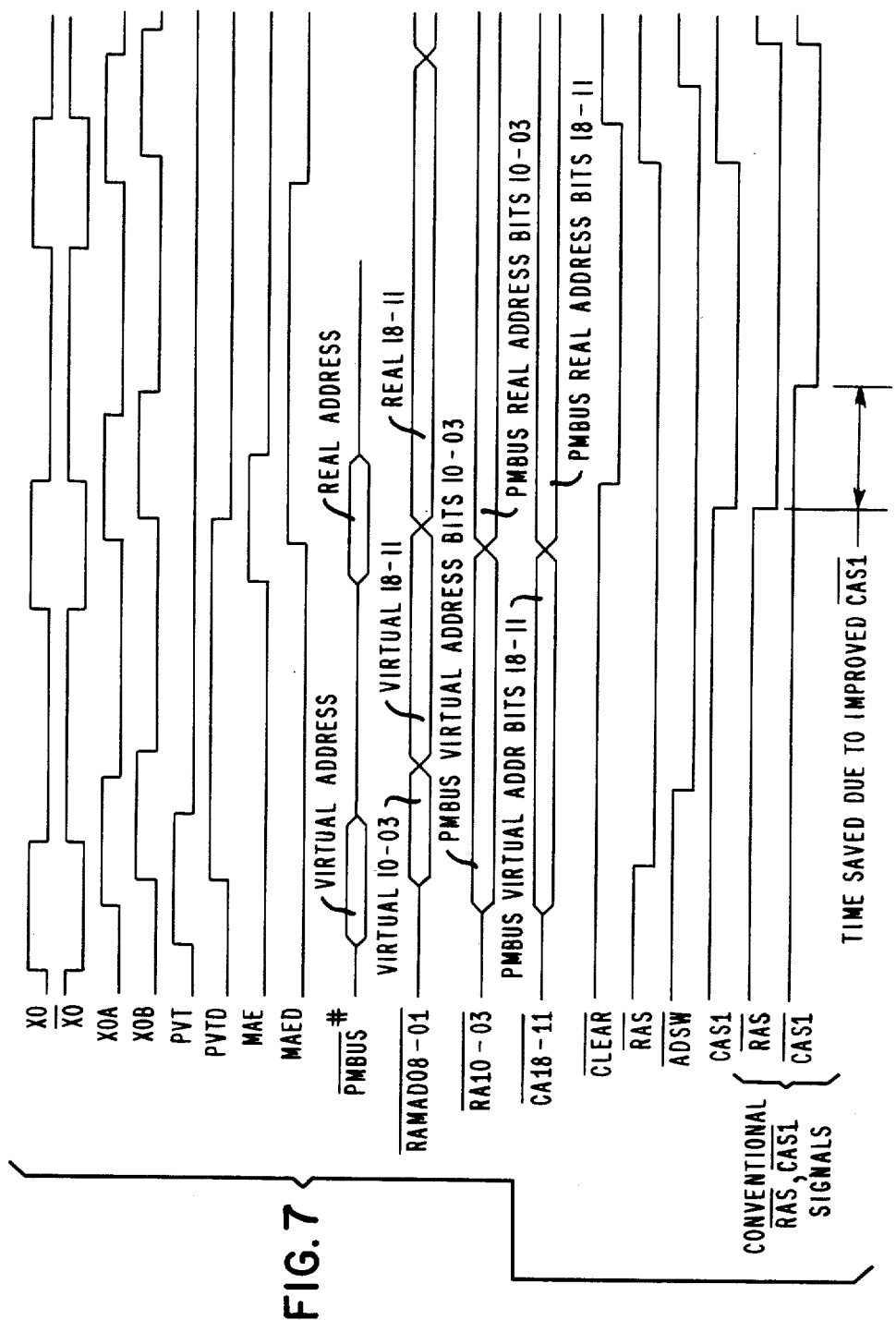
FIG. 7 illustrates a plurality of waveforms indicative of an operation cycle of the present invention.

Referring now to the waveforms of FIG. 7 in conjunction with the logic of FIG. 6. As can be seen from the timing waveforms of FIG. 7, the processor transfers the virtual address onto the $\overline{\text{PMBUS24-03}}$ lines during the first half cycle (designated as $X_O$) by activating the processor virtual transfer (PVT) signal. Bits 01 and 02 of the address are not of present interest since they are used to select a specific byte from the full word and this is done once the word is received back in the processor. At the leading edge of the $X_{OB}$ clock the D flip-flop 90 clocks in the presence of the PVT signal producing the PVTD term. The PVTD signal through the OR gate 95 generates the row address strobe signal $\overline{\text{RAS}}$. The row address bits from latch 84 had propagated through the 2:1 multiplexer circuit to generate the $\overline{\text{RAMAD08-01}}$ signals which are the address inputs to the DRAMs (memory). The $\overline{\text{ADSW}}$ term is inactive, which permitted the $\overline{\text{RA10-03}}$ inputs to appear on the $\overline{\text{RAMAD08-01}}$ outputs. The signal $\overline{\text{RAS}}$ is applied to all banks of the memory circuit which latches into the memory the row address. The $\overline{\text{RAS}}$ complementary signal $\overline{\text{RAS}}$ is propagated through the second delay line 94 to generate the ADSWEN address switch enable signal and the $\overline{\text{CAS}}$ enable signal CASEN. When the $\overline{\text{ADSW}}$ signal is activated (active low), the multiplexer 85 is switched to pick up the inputs CA18-11. Following a successful address translation, the real address is transferred onto the PM Bus 24-03 lines during the next $X_O$ by the address translation element. The memory address enable signal, MAE, is activated which indicates that the address is a real memory address. The OR gate 82 and AND gate 83 again provide a clock to the latch 84. The outputs of the latch are propagated through the multiplexer 85 to the $\overline{\text{RAMAD08-01}}$ lines as the column address. The upper address bits $\overline{\text{AD24-19}}$ propagate through the decoder 86 to generate the bank number select signals BANK1, BANK2, etc. At the leading edge of the $X_{OA}$ clock, the MAE signal allows the JK flip-flop 88 to set so as to generate the bank number select signal. At the leading edge of the $X_{OA}$ clock, the MAE signal allows the flip-flop 88 to set so as to generate MAED and $\overline{\text{MAED}}$. The signal MAED reinforces the signal $\overline{\text{RAS}}$ through the OR gate 95 since the signal PVTD will be resetting at the leading edge of $X_{OB}$. With the appropriate bank number term active, the signal CASEN already active and the signal MAED now active, the gates 98 and 99 will activate the appropriate column address strobe, $\overline{\text{CAS}}$. The column address will be strobed into the appropriate data memory bank.

At the trailing edge of the signal $X_O$ and MAED active, the shift register 92 will shift the D6 input to the Q7 output. For the timing shown, the D6 input was strapped to ground so that the output signal CLEAR would be activated. The particular strapping used is a function of the access times of the DRAMs chosen for the memory design. With CLEAR active, the MAED term will be reset at the next $X_{OA}$ clock which will cause both $\overline{\text{RAS}}$ and $\overline{\text{CAS}}$ to be deactivated. In the event that a successful address translation did not occur, then PVTD resetting would not be reinforced by the signal MAED since the signal MAE would not be generated.

The signal $\overline{RAS}$ would be deactivated without a column address strobe $\overline{CAS}$ being generated.

The detailed logic design of the present invention will change if the page size or density of the DRAM changes. The only changes will be in the area of the multiplexer 85 in that the untranslated low order virtual address bits for a different page size must be matched up against the number of $\overline{RAMAD}$ bits.

The last two timing signals shown in FIG. 7 depict the $\overline{RAS}$, $\overline{CAS1}$ relationship in conventional systems where the $\overline{RAS}$ is not generated until the address translation is complete. By comparing these to the $\overline{RAS}$, $\overline{CAS1}$ of the invention it is apparent that there is a time savings. In the invention, $\overline{RAS}$ is generated while address translation is still underway. $\overline{CAS1}$ is subsequently activated when the address translation completes.

The value of the time saved will be equal to the $\overline{RAS}$ to $\overline{CAS}$ minimum delay requirement for the particular DRAM employed.

Although the invention has been described and illustrated in detail, it is to be understood that the same is by way of illustration and example only, and is not to be taken by way of limitation, the spirit and scope of this invention being limited only by the terms of the appended claims.

I claim:

1. In an apparatus for decreasing the access time to addressable memories containing pages of stored data addressable through real addresses, when virtual addressing is used wherein the apparatus uses a memory bus, at least one bank of addressable memory for storing pages of addressable data, a processor means coupled to the memory bus for providing a virtual address consisting of high and low order bits wherein the lower order bits correspond to real address bits and the higher order bits are translatable to real address bits, an address translator means coupled to the memory bus for translating the provided virtual addresses into real addresses and for forwarding the real address to the memory bus, and a memory interface means for interfacing the addressable memory to the memory bus, the improvement in the memory interface means comprising;

first means for receiving and gating said lower order virtual address bits to said addressable memory to commence memory access prior to the completion of translation by said address translator;

second means for receiving and gating the translated higher order bits of said provided virtual address corresponding to the real address from said memory bus to said addressable memory to complete memory addressing;

a decoder operatively coupled to said second means for receiving and converting select higher order address bits into addressable memory bank select signals;

a first logic means responsive to a virtual address on said memory bus for controlling said first and said second means to cause said first and said second means to hold the high and the low order virtual address bits present on said memory bus during a first cycle and to hold the translated virtual address bits present on said memory bus during a second cycle; and multiplexer means coupled to said first and said second means for receiving and alternately gating to said addressable memory the held low order virtual address bits during said first cycle and the held high order translated address bits during said second cycle.

* * * * *